US012002878B2

(12) United States Patent
Adusumilli et al.

(10) Patent No.: US 12,002,878 B2
(45) Date of Patent: Jun. 4, 2024

(54) IMPLANTED ISOLATION FOR DEVICE INTEGRATION ON A COMMON SUBSTRATE

(71) Applicant: GlobalFoundries U.S. Inc., Santa Clara, CA (US)

(72) Inventors: Siva P. Adusumilli, South Burlington, VT (US); Mark Levy, Williston, VT (US); Jeonghyun Hwang, Ithaca, NY (US)

(73) Assignee: GlobalFoundries U.S. Inc., Santa Clara, CA (US)

( * ) Notice: Subject to any disclaimer, the term of this patent is extended or adjusted under 35 U.S.C. 154(b) by 0 days.

(21) Appl. No.: 18/085,677

(22) Filed: Dec. 21, 2022

(65) Prior Publication Data

US 2023/0121393 A1 Apr. 20, 2023

Related U.S. Application Data

(62) Division of application No. 17/109,538, filed on Dec. 2, 2020, now Pat. No. 11,569,374.

(51) Int. Cl.
*H01L 29/778* (2006.01)
*H01L 27/088* (2006.01)
*H01L 29/04* (2006.01)
*H01L 29/16* (2006.01)
*H01L 29/20* (2006.01)
*H01L 29/66* (2006.01)

(52) U.S. Cl.
CPC ........ *H01L 29/7783* (2013.01); *H01L 27/088* (2013.01); *H01L 29/04* (2013.01); *H01L 29/1602* (2013.01); *H01L 29/2003* (2013.01); *H01L 29/66462* (2013.01)

(58) Field of Classification Search
None
See application file for complete search history.

(56) References Cited

U.S. PATENT DOCUMENTS 8,212,294 B2  7/2012  Hoke et al.
8,665,013 B2  3/2014  Saunders
8,823,146 B1  9/2014  Hoke
(Continued)

OTHER PUBLICATIONS

Lo, C.F. et al., "Isolation blocking voltage of nitrogen ion-implanted AlGaN/GaN high electron mobility transistor structure", Applied Physics Letters 97, 262116 (2010).
(Continued)

*Primary Examiner* — Jack S Chen
(74) *Attorney, Agent, or Firm* — Thompson Hine LLP; Anthony Canale (57) ABSTRACT

Structures including devices, such as transistors, integrated on a semiconductor substrate and methods of forming a structure including devices, such as transistors, integrated on a semiconductor substrate. A first transistor is formed in a first device region of a semiconductor substrate, and a second transistor is formed in a second device region of the semiconductor substrate. The second transistor includes a layer stack on the semiconductor substrate, and the layer stack includes a layer comprised of a III-V compound semiconductor material. A polycrystalline layer includes a section that is positioned in the semiconductor substrate beneath the first device region.

20 Claims, 7 Drawing Sheets

(56) References Cited

U.S. PATENT DOCUMENTS

| | | |
|---|---|---|
| 9,171,911 B2 | 10/2015 | Zhou et al. |
| 9,356,045 B2 | 5/2016 | Comeau et al. |
| 9,685,545 B2 | 6/2017 | Tipirneni et al. |
| 10,192,779 B1 | 1/2019 | Shank et al. |
| 10,312,131 B2 | 6/2019 | Lidow et al. |
| 11,282,740 B2 | 3/2022 | Adusumilli et al. |
| 11,469,225 B2 * | 10/2022 | Levy .................. H01L 27/0623 |
| 11,515,397 B2 | 11/2022 | Stamper et al. |
| 2019/0371886 A1 | 12/2019 | Radosavljevic et al. |
| 2022/0173233 A1 | 6/2022 | Adusumilli et al. |

OTHER PUBLICATIONS

Liu, C. et al., "Lattice expansion of Ca and Ar ion implanted GaN", Applied Physics Letter 71, 2313 (1997).

* cited by examiner

IMPLANTED ISOLATION FOR DEVICE INTEGRATION ON A COMMON SUBSTRATE

BACKGROUND

The present invention relates to semiconductor device fabrication and integrated circuits and, more specifically, to structures including devices, such as transistors, integrated on a semiconductor substrate and methods of forming such structures.

High-voltage power electronic devices, such as high-electron-mobility transistors, may be fabricated using III-V compound semiconductors to exploit their material properties, such as a carrier mobility that is greater than the carrier mobility of silicon. III-V compound semiconductors include Group III elements (aluminum, gallium, indium) combined with Group V elements (nitrogen, phosphorus, arsenic, antimony). A high-electron-mobility transistor may include a heterojunction between crystalline III-V compound semiconductor materials having different band gaps, such as a heterojunction between binary gallium nitride and trinary aluminum-gallium nitride. During operation, a two-dimensional electron gas is formed near an interface at the heterojunction and defines the channel of the high-electron-mobility transistor.

The integration of high-electron-mobility transistors with either field-effect transistors or heterojunction bipolar transistors formed by complementary-metal-oxide-semiconductor (CMOS) processing on the same chip has proven to be a complex process because, for example, of the need to electrically isolate the different devices. Integration may be achieved by wafer bonding or through the use of engineered or hybrid substrates, which by their nature lend significant complexity to processes integrating high-electron-mobility transistors with these other types of transistors.

Improved structures including devices, such as transistors, integrated on a semiconductor substrate and methods of forming such structures are needed.

SUMMARY

In an embodiment of the invention, a structure includes a semiconductor substrate having first and second device regions, a first transistor in the first device region, and a second transistor in the second device region. The second transistor includes a layer stack on the semiconductor substrate, and the layer stack includes a layer comprised of a III-V compound semiconductor material. The structure further includes a polycrystalline layer having a section that is positioned in the semiconductor substrate beneath the first device region.

In an embodiment of the invention, a method includes forming a polycrystalline layer having a section positioned beneath a first device region of a semiconductor substrate, forming a first transistor in the first device region of the semiconductor substrate, forming a layer stack including a layer comprised of a III-V compound semiconductor material in a second device region of the semiconductor substrate, and forming a second transistor using the layer stack.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
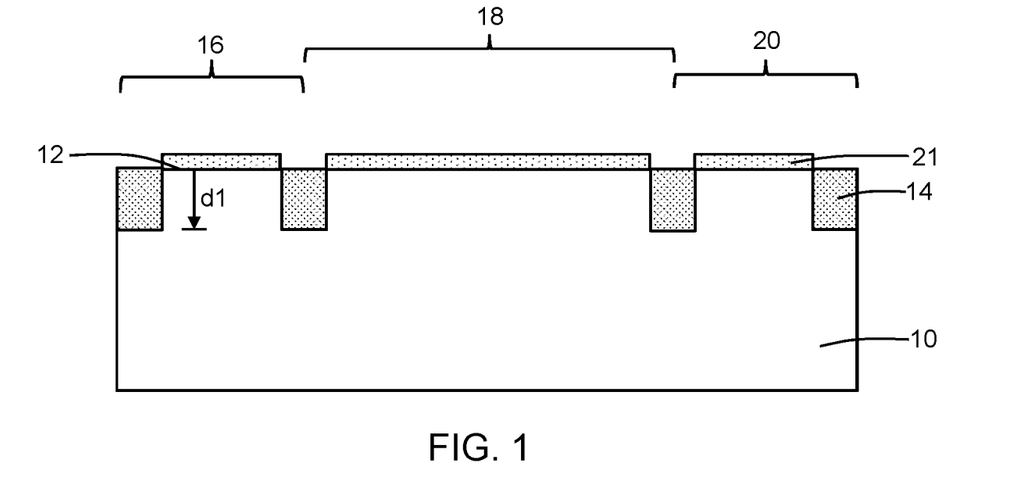
FIGS. 1-3 are cross-sectional views of a structure at successive fabrication stages of a processing method in accordance with embodiments of the invention.

With reference to FIG. 1 and in accordance with embodiments of the invention, a semiconductor substrate 10 is provided that contains a single-crystal semiconductor material, such as single-crystal silicon. The semiconductor substrate 10 has a top surface 12, which may be planar. The semiconductor substrate 10 may be a bulk substrate that contains a single-crystal semiconductor material (e.g., single-crystal silicon). In an embodiment, the single-crystal semiconductor material of the semiconductor substrate 10 may have a diamond crystal lattice structure with a <111> crystal orientation as specified by Miller indices. In an embodiment, the semiconductor substrate 10 may contain single-crystal silicon with a diamond crystal lattice structure having a <111> crystal orientation. For a semiconductor substrate 10 having a <111> crystal orientation, the (111) crystallographic plane is parallel to the top surface 12 of the semiconductor substrate 10, and the [111] crystallographic direction is normal to the (111) plane. The (100) crystallographic axes do not lie in the plane of the top surface 12. The semiconductor substrate 10 may be characterized as a non-silicon-on-insulator substrate (i.e., a non-SOI) substrate) that lacks a buried oxide layer characteristic of a silicon-on-insulator (SOI) substrate. In an embodiment, the semiconductor substrate 10 may be fully comprised of semiconductor material with a <111> crystal orientation.

Shallow trench isolation regions 14 are formed that extend from the top surface 12 of the semiconductor substrate 10 into the semiconductor substrate 10. The shallow trench isolation regions 14 may contain a dielectric material deposited by chemical vapor deposition into trenches etched in the semiconductor substrate 10, polished, and deglazed. The dielectric material contained in the shallow trench isolation regions 14 may comprise silicon dioxide, silicon nitride, silicon carbide, silicon-rich silicon dioxide, or a combination of two or more of these materials. The shallow trench isolation regions 14 may extend to a depth, d1, relative to the top surface 12 into the semiconductor substrate 10. The shallow trench isolation regions 14 surround and define multiple device regions 16, 18, 20, and the shallow trench isolation regions 14 are laterally positioned between the different device regions 16, 18, 20. In an embodiment, the top surface 12 in the device region 18 may be coplanar with the top surface 12 in the device region 16 and may also be coplanar with the top surface 12 in the device region 20.

A pad layer 21, which may be comprised of silicon nitride, is positioned on the top surface 12 in all of the device regions 16, 18, 20. The pad layer 21 may the remnant of a hardmask used to pattern the trenches in which the shallow trench isolation regions 14 are formed. In conventional process flows, the pad layer 21 is removed following the formation of the shallow trench isolation regions 14.

Figure 2:
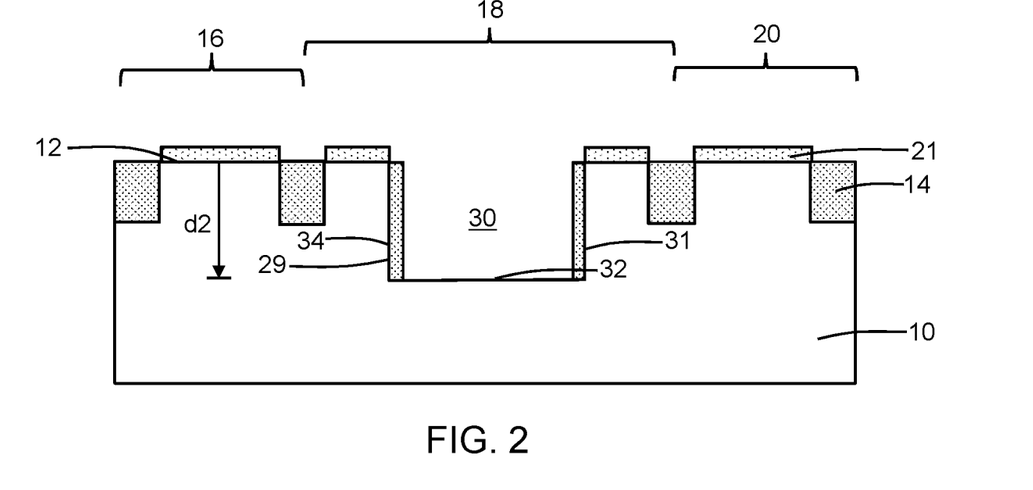

With reference to FIG. 2 in which like reference numerals refer to like features in FIG. 1 and at a subsequent fabrication stage of the processing method, a trench 30 is formed in the semiconductor substrate 10 in the device region 18. To that end, the pad layer 21 is patterned and removed from the device region 18 by lithography and etching processes to define an opening generally located over the device region 18 such that the top surface 12 of the semiconductor substrate 10 in device region 18 is exposed.

The trench 30 is formed in the semiconductor substrate 10 at the location of the opening in the pad layer 21 by etching with an etching process, such as a reactive ion etching process. The trench 30 may extend to a trench bottom 32 coextensive with a surface of the semiconductor substrate 10 and may have side surfaces or sidewalls 29, 31. Portions of the semiconductor substrate 10 are arranged between the trench 30 and the adjacent shallow trench isolation regions 14. The surface 32 at the trench bottom may be located at a depth, d2, in the semiconductor substrate 10 relative to the top surface 12 that is greater than the depth, d1, of the shallow trench isolation regions 14. The pad layer 21, optionally a photoresist used to pattern the trench 30, protects the semiconductor substrate 10 in the device region 16 and the device region 20 during the etching processes. In an embodiment, the surface 32 at the trench bottom may be planar and lack topography. In an embodiment, the top surface 12 may be planar, the surface 32 at the trench bottom may be planar, and the planes of the top surface 12 and the surface 32 may be parallel.

Sidewall spacers 34 are formed adjacent to the sidewalls 29, 31 of the trench 30. The sidewall spacers 34 may extend from the top surface 12 of the semiconductor substrate 10 to the surface 32 at the bottom of the trench 30. The sidewall spacers 34 may be formed by depositing a liner layer comprised of a dielectric material (e.g., silicon nitride) and etching the deposited liner layer with an anisotropic etching process, such as a reactive ion etching process.

Figure 3:
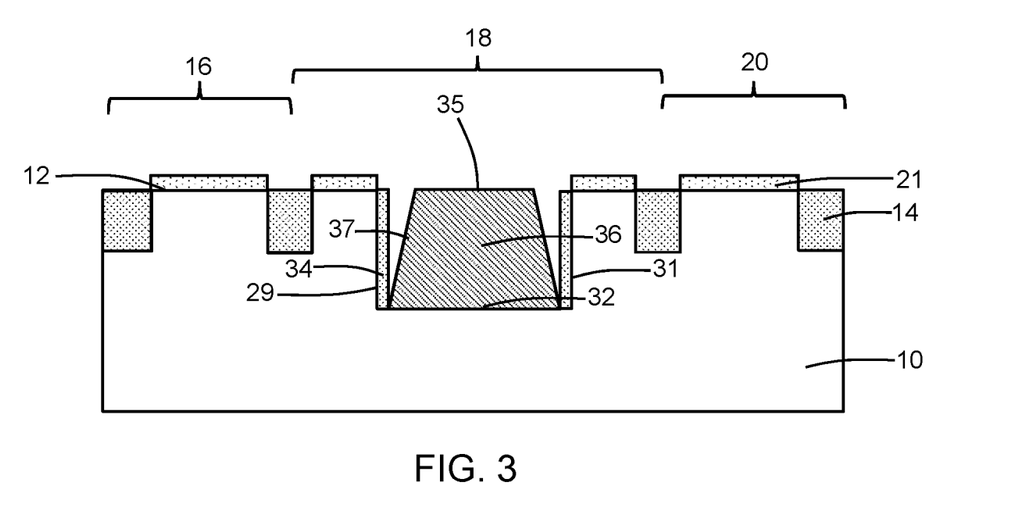
Figure 3A:
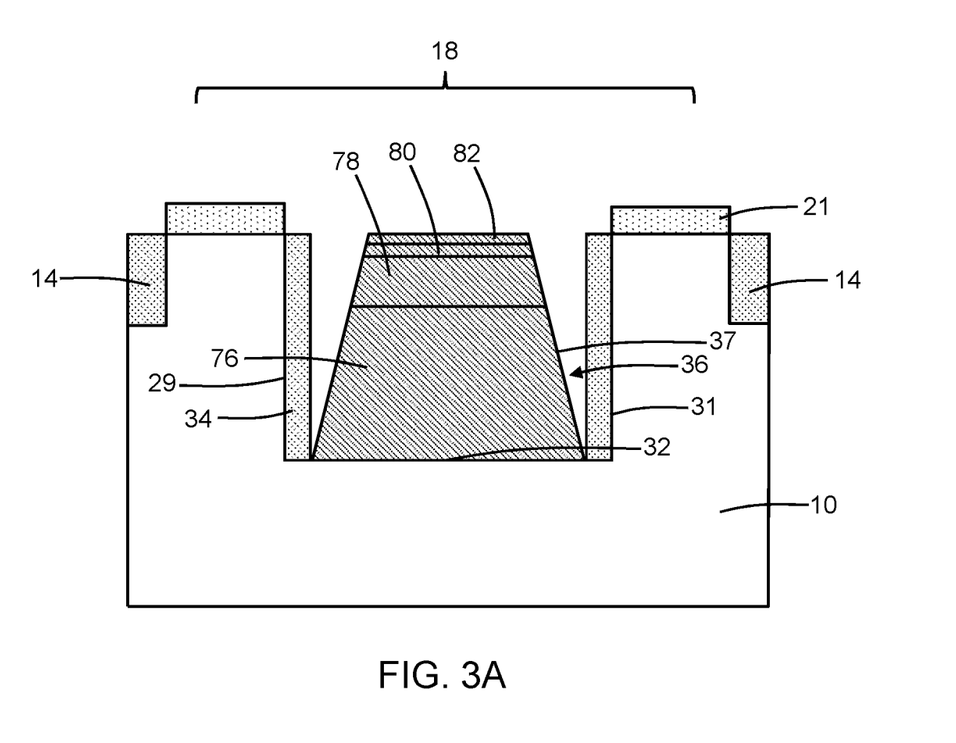
FIG. 3A is an enlarged cross-sectional view of a portion of FIG. 3 in accordance with embodiments of the invention.

With reference to FIGS. 3, 3A in which like reference numerals refer to like features in FIG. 2 and at a subsequent fabrication stage of the processing method, a layer stack 36 containing one or more compound semiconductor layers is formed on the surface 32 of the semiconductor substrate 10 that is located inside the trench 30. In an embodiment, the layer stack 36 may include at least one crystalline layer comprised of a III-V compound semiconductor material. In an embodiment, the layer stack 36 may include at least one crystalline layer comprised of a binary III-V compound semiconductor material. In an embodiment, the layer stack 36 may include at least one crystalline layer comprised of a ternary III-V compound semiconductor material. In an embodiment, the layer stack 36 may include multiple crystalline layers comprised of different III-V compound semiconductor materials. In an embodiment, the layer stack 36 may include at least one crystalline layer comprised of a binary III-V compound semiconductor material and at least one crystalline layer comprised of a ternary III-V compound semiconductor material. In an embodiment, the layer stack 36 may include one or more crystalline layers that contain gallium and nitrogen. In an embodiment, the layer stack 36 may include one or more crystalline layers that contain gallium nitride or a ternary III-V compound semiconductor material based on gallium nitride (e.g., aluminum gallium nitride).

The layer stack 36 may be formed by an epitaxial growth process. Each individual layer of the layer stack 36 may have a crystal structure that is single crystal or, alternatively, a crystal structure that is substantially single crystal with varying levels of crystalline defectivity present. The <111> crystal orientation of the semiconductor material (e.g., single-crystal silicon) of the semiconductor substrate 10 promotes epitaxial growth of the III-V compound semiconductor material(s), such as gallium nitride, of the layer stack 36 with low crystalline defectivity through closer lattice matching than possible with substrates having a <100> crystal orientation. In particular, the atoms on the surface plane of the semiconductor substrate 10 with a <111> crystal orientation are arranged in hexagons, which may lattice match reasonably well with the crystal structure of one or more of the compound semiconductor materials (e.g., the wurtzite crystal structure of gallium nitride that is based on a binary hexagonal close-packed crystal system) in the layer stack 36.

In an embodiment, the layer stack 36 may be formed by a selective epitaxial growth process in which semiconductor material does not form on dielectric surfaces, such as the hardmask 26 and the sidewall spacers 34. In an embodiment, the layer stack 36 may be formed by a non-selective epitaxial growth process in which semiconductor material is deposited and patterned by lithography and etching processes. In an embodiment, the sidewalls 37 of the layer stack 36 may be located adjacent to, and spaced from, the trench sidewalls 29, 31 and, in that instance, the trench 30 may be substantially filled by the layer stack 36. In the representative embodiment, the layer stack 36 has sidewalls 37 that are inwardly inclined away from the trench sidewalls 29, 31 to define, for example, a trapezoidal shape and to space the sidewalls 37 from the trench sidewalls 29, 31. The sidewalls 37 may converge at a top surface 35 of the layer stack 36. In an embodiment, the top surface 35 may be coplanar or substantially coplanar with the top surface 12 of the semiconductor substrate 10. Isolation regions (not shown) may be formed at the top surface 35 of the layer stack 36 by, for example, a masked implantation of either nitrogen or argon.

In an embodiment and as best shown in FIG. 3A, the layer stack 36 may include a buffer layer 76, a channel layer 78, a spacer layer 80, and a barrier layer 82. The layers 76, 78, 80, 82 may be serially formed using an epitaxial growth process, such as metalorganic chemical vapor deposition. The layers 76, 78, 80, 82 may each have a crystal structure that is single crystal or, alternatively, a crystal structure that is substantially single crystal with varying levels of crystalline defectivity present. One or more of the layers 76, 78, 80, 82 may include multiple sub-layers characterized by varying composition or doping. The buffer layer 76 may contain a III-V compound semiconductor material, such as gallium nitride, that is tailored in terms of material composition, doping, and/or layer thickness to accommodate lattice mismatch between the material of the semiconductor substrate 10 and the material of the channel layer 78. The channel layer 78, which is disposed over the buffer layer 76, may contain a III-V compound semiconductor material, such as gallium nitride. The spacer layer 80 and the barrier layer 82 are disposed over the channel layer 78 with the spacer layer 80 between the channel layer 78 and the barrier layer 82. The spacer layer 80, which may be thinner than the channel layer 78, may contain a III-V compound semiconductor, such as aluminum nitride. The barrier layer 82 may contain a III-V compound semiconductor, such as aluminum gallium nitride, aluminum nitride or indium aluminum nitride, that provides an heterogenous interface with the channel layer 78 of different composition. The spacer layer 80 and barrier layer 82, along with the material properties of the channel layer 78, contribute to creating a two-dimensional electron gas, during device operation, at the heterogenous interface that is filled with highly-mobile and abundant electrons.

Figure 4:
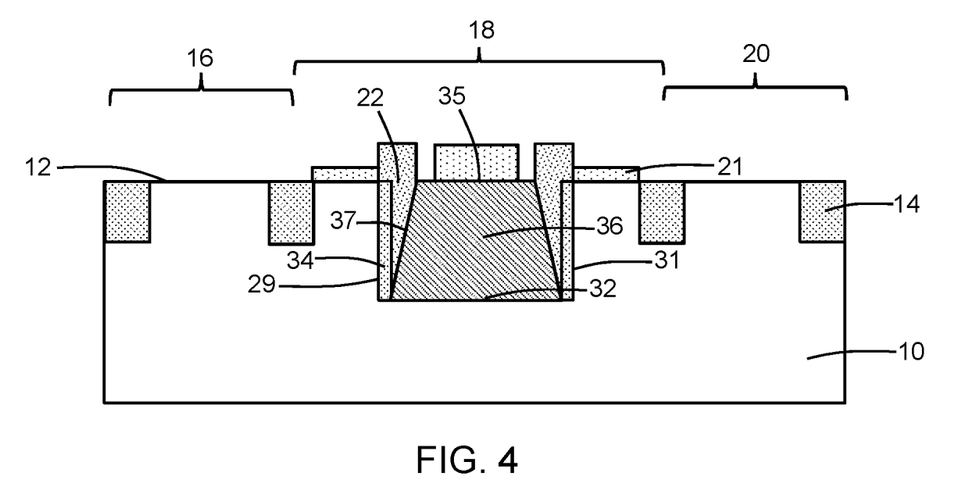
FIGS. 4-6 are cross-sectional views of a structure at successive fabrication stages of the processing method subsequent to FIG. 3.

With reference to FIG. 4 in which like reference numerals refer to like features in FIG. 3 and at a subsequent fabrication stage of the processing method, the pad layer 21 is removed from the device region 16 and from the device region 20 by patterning with lithography and etching processes. A portion of the patterned pad layer 21 remains in the device region 18 on the top surface 12 between the sidewall 29 of the trench 30 and the adjacent shallow trench isolation region 14, and another portion of the patterned pad layer 21 remains in the device region 18 on the top surface 12 between the sidewall 31 of the trench 30 and the adjacent shallow trench isolation region 14.

An implantation mask 22 is applied in the device region 18 that includes a portion centrally over the layer stack 36 and portions that fill the gaps between the layer stack 36 and the sidewalls 29, 31 of the trench 30. The implantation mask 22 includes openings that expose portions of the top surface of the layer stack 36 and thereby determine areas available for implantation. The implantation mask 22 is also absent in the device region 16 and the device region 20. The implantation mask 22 may include a photoresist applied by a spin-coating process, pre-baked, exposed to light projected through a photomask, baked after exposure, and developed with a chemical developer to define openings arranged over the areas to be implanted and shapes over areas to not be implanted.

Figure 5:
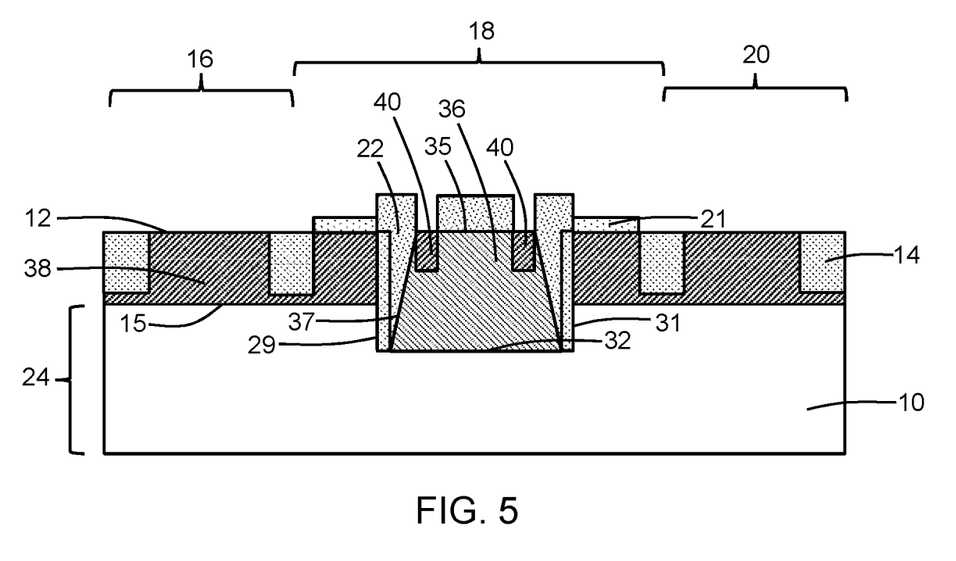

With reference to FIG. 5 in which like reference numerals refer to like features in FIG. 4 and at a subsequent fabrication stage of the processing method, an implanted layer 38 containing damaged or amorphous semiconductor material is formed in the semiconductor substrate 10 beneath a top surface 12 of the semiconductor substrate 10 in the entirety of the device region 16 and the device region 20. In device region 18, the implanted layer 38 is also formed in the portions of the semiconductor substrate 10 between the sidewalls 29, 31 of the trench 30 and the respective adjacent shallow trench isolation region 14. Implanted regions 40 are formed in the layer stack 36 with locations defined by the implantation mask 22.

The implanted layer 38 and the implanted regions 40 may be concurrently formed by an ion implantation process that introduces energetic ions with ion trajectories that impinge the top surface 12 and travel in paths within the semiconductor substrate 10 and the layer stack 36. The energetic ions lose energy along their paths via stochastic scattering events with atomic nuclei and electrons in the traversed semiconductor materials, and eventually stop after their energy is dissipated. Energy lost in nuclear collisions displaces target atoms of the semiconductor substrate 10 and layer stack 36 from their original lattice sites, which damages their respective crystal lattice structures. The crystal lattice structure of the semiconductor substrate 10 is damaged or amorphized within the implanted layer 38 in comparison with an undamaged region 24 of the semiconductor material of the semiconductor substrate 10 positioned below a lower boundary 15 of the implanted layer 38 and the non-implanted portions of the layer stack 36. In an embodiment, the implanted layer 38 in the semiconductor substrate 10 may extend from the lower boundary 15 to the top surface 12. In an embodiment, the lower boundary 15 may be planar. In alternative embodiments, the lower boundary 15 may be shallower beneath the pad layer 21, which functions to locally increase the material thickness during implantation and reduces the ion range in portions of the semiconductor substrate 10 beneath the pad layer 21.

The implanted regions 40 in the layer stack 36 extend to a shallow depth within the layer stack 36 and may be located adjacent to the sidewalls 37. In an embodiment, the implanted regions 40 extend in the layer stack 36 through the interface between the channel layer 78 and barrier layer 82 to define the bounds of the region in the layer stack 36 for the two-dimensional electron gas during use.

The ions may be generated from a suitable source gas and implanted into the semiconductor substrate 10 and layer stack 36 with one or more implantation conditions using an ion implantation tool. The implantation conditions (e.g., ion species, dose, energy) for the ion implantation process may be selected to tune the characteristics of the implanted layer 38 and implanted regions 40. In an embodiment, the ions may be generated from a noble gas, such as argon or xenon. In an embodiment, the dose of argon ions may be greater than or equal to $1 \times 10^{14}$ ions/cm$^2$. In an embodiment, the dose of argon ions may range from about $1 \times 10^{14}$ ions/cm$^2$ to about $5 \times 10^{15}$ ions/cm$^2$. In an embodiment, the energy of the argon ions may range from about 30 keV to about 1000 keV. The dose and energy for other implanted noble gas ion species may be similar to, or different from, those of argon. The ion implantation conditions may include a single implantation, multiple implantations performed at different energies, segmented implantations, etc.

Figure 6:
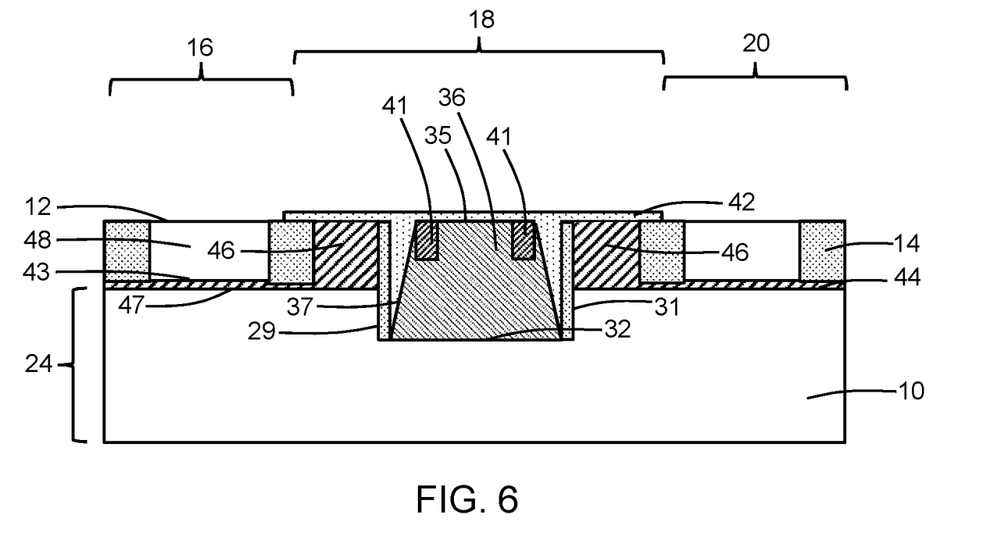
Figure 6A:
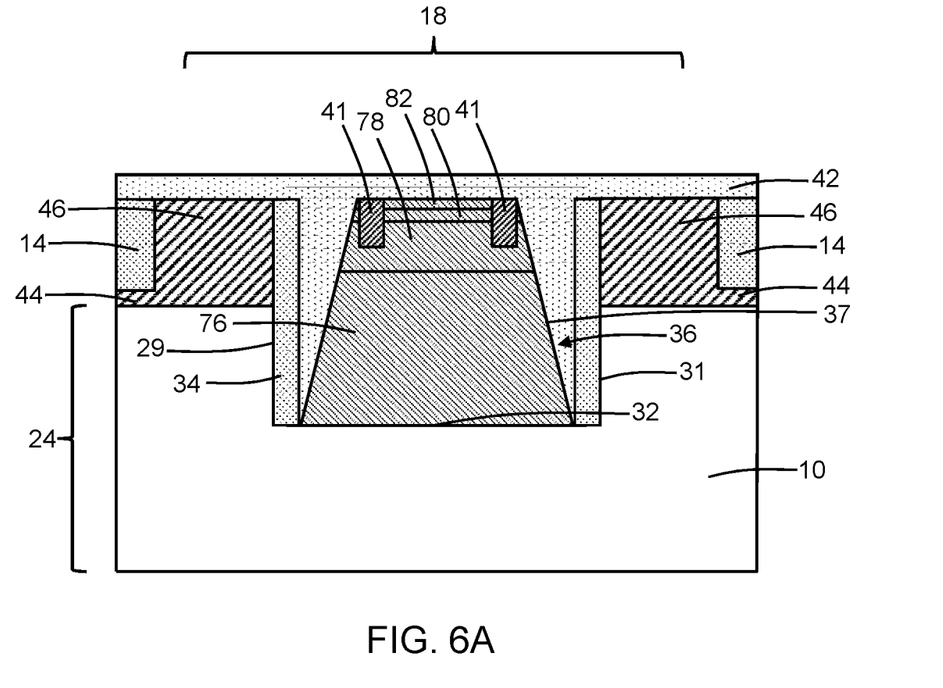
FIG. 6A is an enlarged cross-sectional view of a portion of FIG. 6 in accordance with embodiments of the invention.

With reference to FIGS. 6, 6A in which like reference numerals refer to like features in FIG. 5 and at a subsequent fabrication stage of the processing method, the remaining pad layer 21 and the implantation mask 22 are removed. A dielectric layer 42 may be deposited and patterned to cover the layer stack 36 in device region 18. The dielectric layer 42 is removed from the device region 16 and the device region 20 during patterning such that the top surface 12 of the semiconductor substrate 10 is exposed in device regions 16, 20. The dielectric layer 42 is comprised of a dielectric material, such as silicon dioxide.

The damaged semiconductor material in the implanted layer 38 is converted into a polycrystalline layer 44 and polycrystalline regions 46 in the semiconductor substrate 10 by performing a thermal treatment (i.e., annealing process). In an embodiment, the thermal treatment used to thermally treat the implanted layer 38 of the semiconductor substrate 10 and form the polycrystalline layer 44 and polycrystalline regions 46 may be a rapid thermal anneal. In an embodiment, the rapid thermal anneal may be performed using, for example, a bank of flash lamps that heat the semiconductor substrate 10 to a peak temperature in a range of 900° C. to 1125° C. with a dwell time at the peak temperature of 30 milliseconds to 5 seconds and, in a particular embodiment, the peak temperature may be 1000° C. held for a dwell time of less than or equal to 1 second.

The polycrystalline layer 44 and polycrystalline regions 46 contain grains of polycrystalline semiconductor material (e.g., polysilicon). The polycrystalline layer 44 and polycrystalline regions 46 may also contain defects as residual damage in addition to the polycrystalline grains, and the defects may contain trapped atoms of the implanted species (e.g., argon or xenon). In the device region 16 and the device region 20, the thermal treatment also recrystallizes the damaged semiconductor material of the implanted layer 38 between the polycrystalline layer 44 and the top surface 12 into a layer 48 of the semiconductor substrate 10 that includes recrystallized semiconductor material (e.g., recrystallized single-crystal silicon). In the device region 16, the damaged semiconductor material of the implanted layer 38 is not recrystallized due to the presence of the dielectric layer 42 and, following the thermal treatment, the polycrystalline regions 46 may extend to the top surface 12. In contrast to the polycrystalline layer 44 and polycrystalline regions 46, the recrystallized single-crystal semiconductor material in the layer 48 lacks polycrystalline grains and defects, and may also lack atoms of the implanted species.

The polycrystalline regions 46 are positioned adjacent to the trench 30 and, more specifically, are positioned adjacent to the sidewalls 29, 31 of the trench 30. The polycrystalline layer 44 includes a section in device region 16 and a section in device region 20, but is absent in device region 18 beneath the trench 30. The section of the polycrystalline layer 44 in device region 16 extends beneath the intervening shallow trench isolation region 14 to connect to one of the polycrystalline regions 46 in device region 18. Similarly, the section of the polycrystalline layer 44 in device region 20 extends beneath the intervening shallow trench isolation region 14 to connect to another of the polycrystalline regions 46 in device region 18. In each instance, the respective polycrystalline regions 46 extend from the top surface 12 to connect to one or the other of the sections of the polycrystalline layer 44. In an embodiment, the sections of the polycrystalline layer 44 may extend laterally relative to the top surface 12 beneath the entirety of each of the device regions 16 and 20. For example, the section of the polycrystalline layer 44 in device region 16 may extend laterally relative to the top surface 12 between the shallow trench isolation regions 14 surrounding the device region 16 and contact these shallow trench isolation regions 14, and the section of the polycrystalline layer 44 in device region 20 may extend laterally relative to the top surface 12 between the shallow trench isolation regions 14 surrounding the device region 20 and contact these shallow trench isolation regions 14.

The recrystallized single-crystal layer 48 is located between an upper boundary 43 of the polycrystalline layer 44 and the top surface 12 of the semiconductor substrate 10 in device region 16 and device region 20. The semiconductor substrate 10 also includes single-crystal semiconductor material in the undamaged region 24 below a lower boundary 47 of the polycrystalline layer 44 and polycrystalline regions 46. As a result, the polycrystalline layer 44 is buried beneath the top surface 12 in the device region 16 and device region 20, and is embedded in the single-crystal semiconductor material of the semiconductor substrate 10.

The polycrystalline layer 44 and polycrystalline regions 46 may be characterized as trap-rich material having an electrical resistivity that is greater than or equal to the electrical resistivity of the single-crystal semiconductor material of the semiconductor substrate 10. In an embodiment, the polycrystalline layer 44 and polycrystalline regions 46 may have an electrical resistivity that is greater than or equal to 1,000 ohm-cm. In an embodiment, the electrical resistivity of the polycrystalline layer 44 and the electrical resistivity of the polycrystalline regions 46 may be within a range of about 10,000 ohm-cm to about 1,000,000 ohm-cm.

The polycrystalline regions 46 in device region 18 provide enhanced electrical isolation between the layer stack 36 and device region 16, as well as between the layer stack 36 and the device region 20. The polycrystalline regions 46 may be coextensive with the adjacent shallow trench isolation regions 14.

In an embodiment, the implanted regions 40 in the layer stack 36 may be recrystallized by the thermal treatment into isolation regions 41 that include single-crystal or substantially single-crystal semiconductor material containing an atomic concentration of the implanted ion species. The atomic concentration of the implanted ion species converts the semiconductor material of the layer stack 36 into an electrical insulator. The isolation regions 40 may extend to a shallower depth into the layer stack 36 than the depth of the polycrystalline layer 44.

Figure 7:
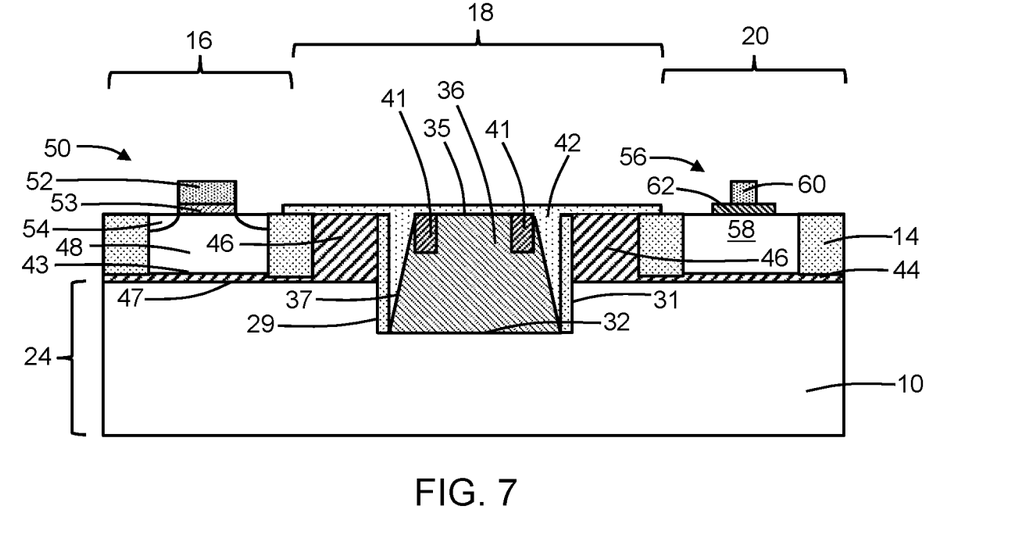
FIGS. 7-8 are cross-sectional views of a structure at successive fabrication stages of the processing method subsequent to FIG. 6.

With reference to FIG. 7 in which like reference numerals refer to like features in FIG. 6 and at a subsequent fabrication stage of the processing method, a field-effect transistor 50 may be fabricated by complementary-metal-oxide (CMOS) processing to form a device structure in the device region 16 of the semiconductor substrate 10. The field-effect transistor 50 may include a gate electrode 52, a gate dielectric 53, source/drain regions 54, and a channel region beneath the gate electrode 52. The gate electrode 52 and gate dielectric 53 are formed on the top surface 12 of the semiconductor substrate 10. The source/drain regions 54 and the channel region of the field-effect transistor 50 contain respective portions of the single-crystal semiconductor material of the semiconductor substrate 10. The source/drain regions 54 are positioned at least in part beneath the top surface 12, and the channel region is positioned beneath the top surface 12 generally between the source/drain regions 54.

A bipolar junction transistor 56 may be fabricated as a device structure in the device region 20 of the semiconductor substrate 10. The bipolar junction transistor 56 may include multiple terminals in the form of a collector 58 defined in the semiconductor substrate 10, an emitter 60, and a base layer 62 arranged between the collector 58 and emitter 60. The base layer 62 may contain single-crystal semiconductor material (e.g., silicon-germanium) that is epitaxially grown on the top surface 12 of the semiconductor substrate 10. In an embodiment, the collector 58 and emitter 60 may contain n-type semiconductor materials, and the base layer 62 may contain p-type semiconductor material to define an NPN bipolar junction transistor.

The field-effect transistor 50 and the bipolar junction transistor 56 constitute different types or classifications of transistor structures. A difference between the field-effect transistor 50 and the bipolar junction transistor 56 is that only majority charge carriers flow in the field-effect transistor 50, whereas both majority and minority charge carriers flow in the bipolar junction transistor 56. The field-effect transistor 50 and the bipolar junction transistor 56 do not include any layers of silicon carbide in their respective constructions and, therefore, are free of silicon carbide. The field-effect transistor 50 and the bipolar junction transistor 56 are both formed on semiconductor material characterized by the same <111> crystal orientation as the semiconductor material used to form the layer stack 36.

Figure 8:
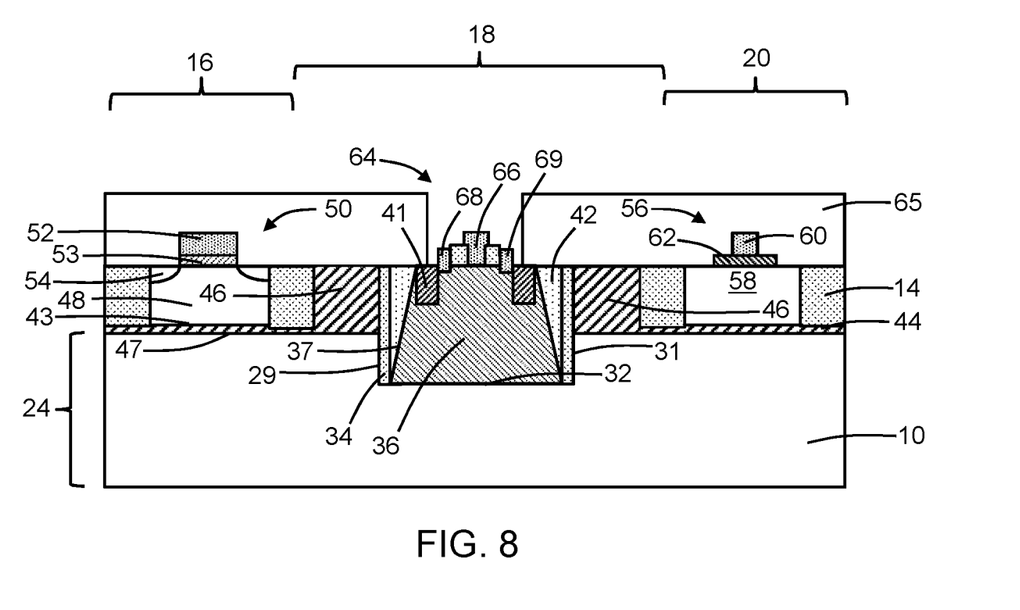
Figure 8A:
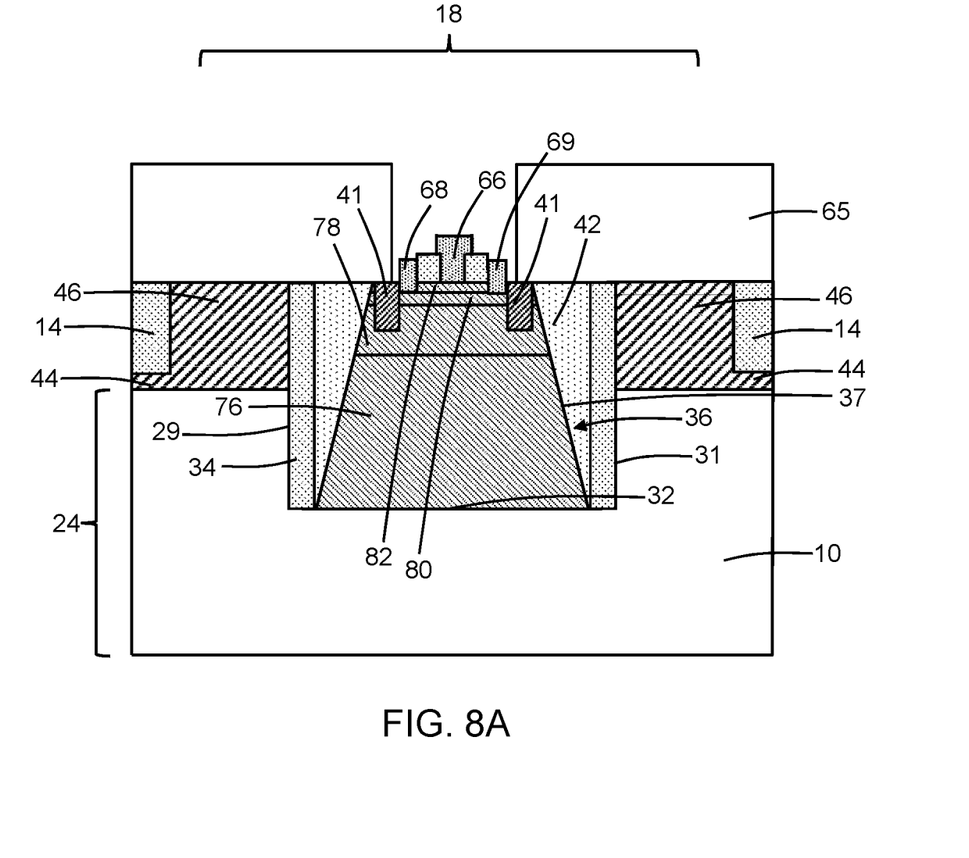
FIG. 8A is an enlarged cross-sectional view of a portion of FIG. 8 in accordance with embodiments of the invention.

With reference to FIGS. 8, 8A in which like reference numerals refer to like features in FIG. 7 and at a subsequent fabrication stage of the processing method, the dielectric layer 42 is partially removed from device region 18 by an etching process. Portions of the dielectric layer 42 remain inside the trench 30 in the spaces between the sidewalls 37 of the layer stack 36 and the sidewall spacers 34. One or more dielectric layers 65 are formed over all of the device regions 16, 18, 20. The one or more dielectric layers 65 are patterned to define an opening in the device region 18 that exposes the layer stack 36.

A transistor 64 is formed as a device structure in device region 18 using the layer stack 36. The transistor 64 includes a gate electrode 66, a source region 68, and a drain region 69 that may be formed in a dielectric layer provided on the top surface of the layer stack 36. The gate electrode 66, source region 68, and drain region 69 may be comprised of a metal, such as a metal nitride. Metal atoms from the source region 68 and drain region 69 may diffuse into the layer stack 36.

The transistor 64 is not formed by CMOS processes and, therefore, may be considered to be a non-CMOS transistor. In an embodiment, the transistor 64 may be a high-electron-mobility transistor (HEMT). In an embodiment, the transistor 64 may be a metal-insulator-semiconductor high-electron-mobility transistor (MISHEMT). In an embodiment, the transistor 64 may be a metal-oxide-semiconductor high-electron-mobility transistor (MOSHEMT). In embodiments, the device region 18 may further include deep trench isolation regions for electrical isolation and/or through-silicon vias for electrical connections.

Middle-of-line processing and back-end-of-line processing follow, which includes formation of contacts, vias, and wiring for an interconnect structure positioned over the semiconductor substrate 10 and above the transistors 50, 56, 64. Various metallization levels, such as the first metallization (M1) level, may be formed that are coupled with the field-effect transistor 50, the bipolar junction transistor 56, and the transistor 64. To that end, the opening in the one or more dielectric layers 65 may be filled with dielectric material before forming the metallization levels.

The polycrystalline regions 46 in device region 18 provide lateral electrical isolation between the field-effect transistor 50 in device region 16 and the transistor 64 in device region 18 and between the bipolar junction transistor 56 in device region 20 and the transistor 64 in device region 18. The polycrystalline layer 44 provides vertical electrical isolation for the field-effect transistor 50 in device region 16 and the bipolar junction transistor 56 in device region 20. The isolation provided by the polycrystalline layer 44 and polycrystalline regions 46 may prevent cross-talk and improve radiofrequency performance.

Figure 9:
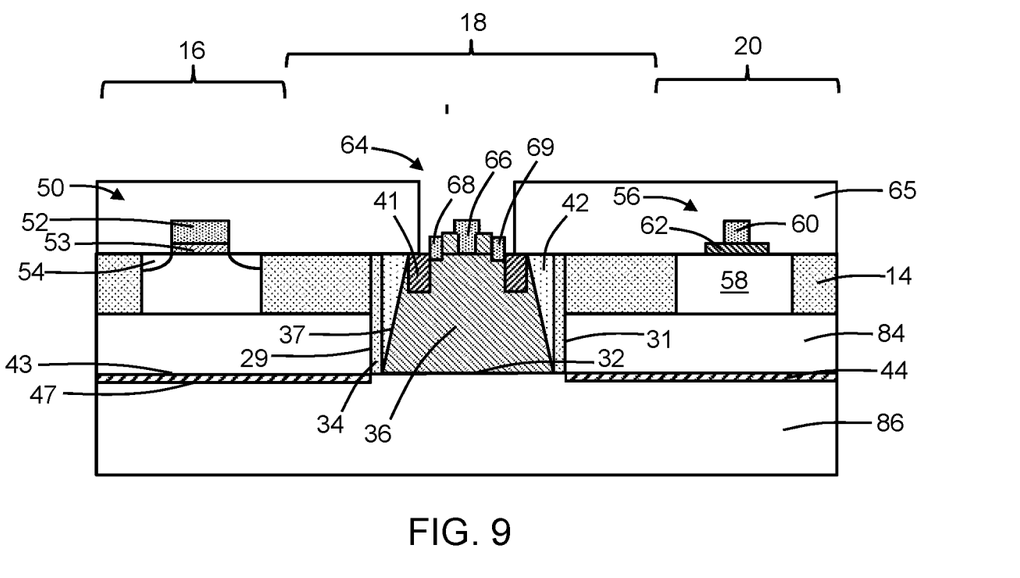
FIGS. 9 and 10 are cross-sectional views of structures in accordance with alternative embodiments of the invention.

With reference to FIG. 9 and in accordance with alternative embodiments, the semiconductor substrate 10 may be a silicon-on-insulator substrate that includes a buried oxide layer 84 and a handle substrate 86 characterized by a <111> crystal orientation. By controlling the implantation conditions for the implanted layer 38, the polycrystalline layer 44 formed by the thermal treatment of the implanted layer 38 may be located beneath the buried oxide layer 84. The trench 30 extends through the buried oxide layer 84 to the handle substrate 86 in device region 18, and the layer stack 36 is epitaxially grown on the handle substrate 86. The field-effect transistor 50 in device region 16 and the bipolar junction transistor 56 in device region 20 are formed using a device layer of the silicon-on-insulator substrate.

Figure 10:
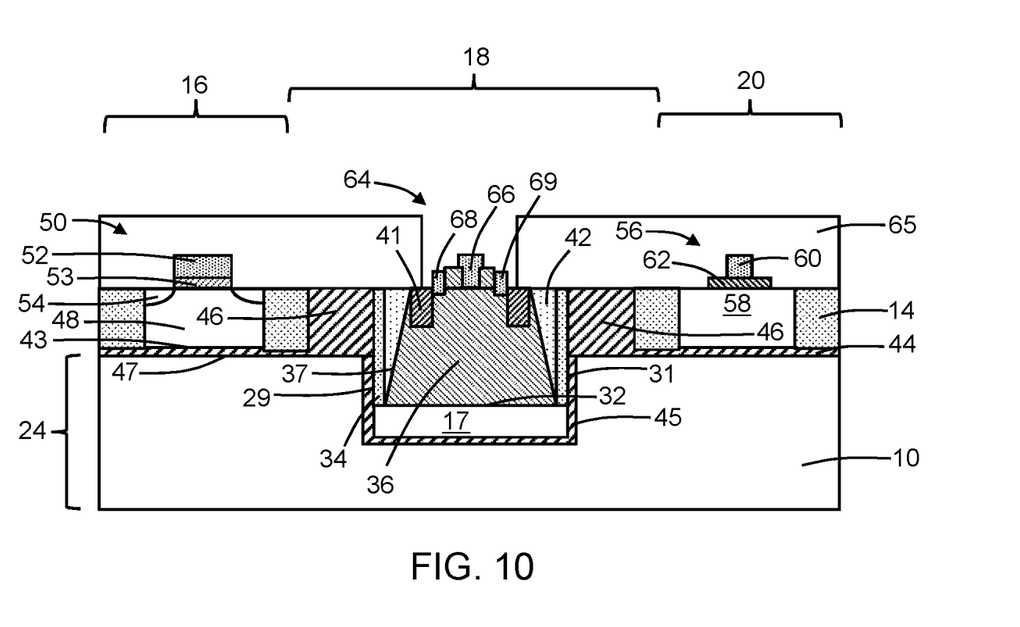

With reference to FIG. 10 and in accordance with alternative embodiments, a polycrystalline layer 45 may be formed in the semiconductor substrate 10 about the periphery of the trench 30. More specifically, the polycrystalline layer 45 may be located adjacent to the trench bottom located at the surface 32 and in the semiconductor substrate 10 adjacent to the sidewalls 29, 31. The polycrystalline layer 45 may be formed by an ion implantation process generated damaged semiconductor material in an implanted layer, similar to implanted layer 38, adjacent to the surface 32 and sidewalls 29, 31 of the trench 30 before forming the layer stack 36. The implanted layer may be converted into the polycrystalline layer 45 by the same thermal treatment used to form the polycrystalline layer 44 and polycrystalline regions 46. A recrystallized layer 17 of single-crystal semiconductor material is located between the polycrystalline layer 45 and the surface 32 of the semiconductor substrate 10 at the trench bottom. The device region 16 and device region 20 may be masked by an implantation mask, similar to implantation mask 22, during the implantation process used as part of the process flow to form the polycrystalline layer 45.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method comprising:
   forming a first section of a polycrystalline layer in a semiconductor substrate beneath a first device region of the semiconductor substrate;
   forming a first transistor in the first device region;
   forming a layer stack including a layer comprising a III-V compound semiconductor material in a second device region of the semiconductor substrate; and
   forming a second transistor using the layer stack.

2. The method of claim 1 further comprising:
   forming an isolation region in the layer stack.

3. The method of claim 2 wherein the isolation region and the polycrystalline layer are concurrently formed.

4. The method of claim 2 wherein the semiconductor substrate includes a top surface, the first section of the polycrystalline layer is located at a first depth relative to the top surface of the semiconductor substrate, the layer stack includes a top surface, the isolation region is located at a second depth relative to the top surface of the layer stack, and the second depth is less than the first depth.

5. The method of claim 1 further comprising:
   patterning a trench in the semiconductor substrate,
   wherein the layer stack is formed on the semiconductor substrate inside the trench.

6. The method of claim 5 further comprising:
   forming a polycrystalline region in the semiconductor substrate adjacent to the trench.

7. The method of claim 6 wherein the semiconductor substrate includes a first surface, and the polycrystalline region extends from the first surface to the first section of the polycrystalline layer.

8. The method of claim 7 wherein the semiconductor substrate has a second surface at a bottom of the trench, the trench includes a sidewall that extends from the first surface to the second surface, the layer stack is positioned on the second surface of the semiconductor substrate, and the polycrystalline region is positioned adjacent to the sidewall of the trench.

9. The method of claim 8 further comprising:
   forming a shallow trench isolation region in the semiconductor substrate,
   wherein the shallow trench isolation region is laterally positioned between the first device region and the second device region, and the polycrystalline region is laterally positioned between the sidewall of the trench and the shallow trench isolation region.

10. The method of claim 8 further comprising:
    forming a second section of the polycrystalline layer in the semiconductor substrate beneath the second surface of the semiconductor substrate at the bottom of the trench.

11. The method of claim 8 wherein the polycrystalline layer is absent beneath the second surface of the semiconductor substrate at the bottom of the trench.

12. The method of claim 6 further comprising:
    forming a shallow trench isolation region in the semiconductor substrate,
    wherein the shallow trench isolation region is laterally positioned between the first device region and the second device region, and the first section of the polycrystalline layer extends laterally beneath the shallow trench isolation region to the polycrystalline region.

13. The method of claim 1 wherein the semiconductor substrate includes a buried oxide layer in the first device region, and the buried oxide layer is positioned between the first section of the polycrystalline layer and the first device region.

14. The method of claim 1 wherein the semiconductor substrate has a top surface, and the first section of the polycrystalline layer extends laterally relative to the top surface beneath an entirety of the first device region.

15. The method of claim 14 wherein the semiconductor substrate has a third device region, and further comprising:
    forming a third transistor in the third device region; and
    forming a second section of the polycrystalline layer that is positioned in the semiconductor substrate beneath the second device region.

16. The method of claim 15 wherein the second section of the polycrystalline layer extends laterally relative to the top surface beneath an entirety of the third device region.

17. The method of claim 15 wherein the first transistor and the second transistor are different types of transistors.

18. The method of claim 17 wherein the first transistor is a field-effect transistor including a source/drain region positioned in the semiconductor substrate at least in part beneath the top surface, and the third transistor is a bipolar junction transistor including a terminal positioned in the semiconductor substrate at least in part beneath the top surface.

19. The method of claim 1 wherein the semiconductor substrate comprises a single-crystal semiconductor material having a diamond crystal lattice structure and a <111> crystal orientation.

20. The method of claim 19 wherein the semiconductor substrate is a bulk substrate, the single-crystal semiconductor material comprises single-crystal silicon, and the III-V compound semiconductor material comprises gallium nitride that is substantially single crystal.

* * * * *